(12) United States Patent
Qiao et al.

(10) Patent No.: US 12,366,943 B2
(45) Date of Patent: Jul. 22, 2025

(54) DISPLAY SUBSTRATE, DISPLAY PANEL AND DISPLAY APPARATUS

(71) Applicants: Chongqing BOE Display Technology Co., Ltd., Chongqing (CN); BOE Technology Group Co., Ltd., Beijing (CN)

(72) Inventors: Huina Qiao, Beijing (CN); Yunte Chen, Beijing (CN); Fan He, Beijing (CN); Jun Yan, Beijing (CN); Yingxi Cui, Beijing (CN); Xuepei Cheng, Beijing (CN); Lubiao Sun, Beijing (CN); Le Peng, Beijing (CN); Zhengde Liu, Beijing (CN); Xuelin Zou, Beijing (CN); Qiang Guo, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/028,082

(22) PCT Filed: Nov. 26, 2020

(86) PCT No.: PCT/CN2020/131927
§ 371 (c)(1),
(2) Date: Mar. 23, 2023

(87) PCT Pub. No.: WO2022/109950
PCT Pub. Date: Jun. 2, 2022

(65) Prior Publication Data
US 2024/0028167 A1   Jan. 25, 2024

(51) Int. Cl.
*G06F 3/044* (2006.01)
*G02F 1/1333* (2006.01)
(Continued)

(52) U.S. Cl.
CPC .......... *G06F 3/0443* (2019.05); *G06F 3/0412* (2013.01); *G06F 3/0446* (2019.05);
(Continued)

(58) Field of Classification Search
CPC .... G06F 3/0443; G06F 3/0412; G06F 3/0446; G06F 2203/04111; G06F 3/04164;
(Continued)

(56) References Cited

U.S. PATENT DOCUMENTS

2014/0374763 A1   12/2014   Zhou et al.
2018/0047802 A1*  2/2018   Yoon ................. H10K 59/1213
(Continued)

FOREIGN PATENT DOCUMENTS

CN        108646952 A     10/2018
CN        110190104 A     8/2019
(Continued)

OTHER PUBLICATIONS

Office Action received for Chinese Patent Application No. 202080003032.0, mailed on Dec. 26, 2024, 19 pages (12 pages of English Translation and 7 pages of Original Document).

*Primary Examiner* — Douglas Wilson
(74) *Attorney, Agent, or Firm* — ArentFox Schiff LLP; Michael Fainberg

(57) ABSTRACT

A display substrate, a display panel and a display apparatus are provided. The display substrate comprises a base substrate, which includes a display area and a non-display area on one side of the display area; an encapsulation dam in the non-display area and arranged around the display area, where an organic insulating layer has a groove structure on the side of the packaging dam away from the display area; and a touch structure, which is located on the side of the organic insulating layer facing away from the base substrate, and which comprises a plurality of touch lines extending to
(Continued)

the non-display area; an inorganic insulating layer has a hollow structure on the side of the packaging dam away from the display area, and the hollow structure covers the groove structure and does not overlap with the orthographic projection of the plurality of touch lines.

20 Claims, 12 Drawing Sheets

(51) Int. Cl.
| | |
|---|---|
| *G06F 3/041* | (2006.01) |
| *G09F 9/30* | (2006.01) |
| *H10D 86/40* | (2025.01) |
| *H10K 50/844* | (2023.01) |
| *H10K 59/122* | (2023.01) |
| *H10K 59/124* | (2023.01) |
| *H10K 59/40* | (2023.01) |
| *H10K 59/80* | (2023.01) |
| *H10K 71/00* | (2023.01) |
| *H10K 102/00* | (2023.01) |
| *H10D 86/60* | (2025.01) |
| *H10K 59/12* | (2023.01) |

(52) U.S. Cl.
CPC ......... *H10K 59/122* (2023.02); *H10K 59/124* (2023.02); *H10K 59/40* (2023.02); *H10K 59/873* (2023.02); *G02F 1/133305* (2013.01); *G02F 1/133345* (2013.01); *G02F 1/133357* (2021.01); *G09F 9/301* (2013.01); *H10D 86/443* (2025.01); *H10D 86/60* (2025.01); *H10K 50/844* (2023.02); *H10K 59/1201* (2023.02); *H10K 71/821* (2023.02); *H10K 2102/311* (2023.02)

(58) Field of Classification Search
CPC .... G06F 3/041; H10K 59/122; H10K 59/124; H10K 59/40; H10K 59/873; H10K 50/844; H10K 59/1201; H10K 71/821; H10K 2102/311; H10K 59/131; G02F 1/133305; G02F 1/133345; G02F 1/133357; G02F 1/13; H01L 27/1244; G09F 9/301; Y02P 70/50
See application file for complete search history.

(56) References Cited

U.S. PATENT DOCUMENTS

| | | | |
|---|---|---|---|
| 2018/0166652 A1* | 6/2018 | Kim | B32B 27/308 |
| 2020/0133435 A1 | 4/2020 | Liu et al. | |
| 2020/0278585 A1* | 9/2020 | Kajita | G06F 3/0446 |
| 2021/0265429 A1* | 8/2021 | Yamanaka | G09F 9/00 |
| 2021/0343812 A1* | 11/2021 | Okazaki | H10K 59/1213 |
| 2021/0399261 A1* | 12/2021 | Murakami | H10K 71/00 |
| 2022/0382401 A1* | 12/2022 | Kim | H10K 59/38 |
| 2023/0016019 A1* | 1/2023 | Park | H10K 59/88 |
| 2023/0393680 A1* | 12/2023 | Bae | G06F 3/0443 |

FOREIGN PATENT DOCUMENTS

| | | |
|---|---|---|
| CN | 110379310 A | 10/2019 |
| CN | 111584750 A | 8/2020 |
| WO | 2020/012611 A1 | 1/2020 |
| WO | 2020/065932 A1 | 4/2020 |

\* cited by examiner

DISPLAY SUBSTRATE, DISPLAY PANEL AND DISPLAY APPARATUS

CROSS REFERENCE TO RELATED APPLICATIONS

This application is a national phase entry under 35 U.S.C. § 371 of International Application No. PCT/CN2020/131927, filed on Nov. 26, 2020, the entire content of which is incorporated herein by reference.

FIELD

The disclosure relates to the field of display technology, in particular to a display substrate, a display panel and a display apparatus.

BACKGROUND

An organic light emitting diode (OLED) display apparatus is a display screen based on an organic light emitting diode. It has excellent characteristics of self-illumination, high contrast, small thickness, wide viewing angle, high response speed, capable of being used for flexible panels, wide range of use temperature, simple structure and manufacturing process and the like, has attracted more and more attention, and has broad application prospects. Generally, a touch function may be integrated by embedding a touch structure in an OLED display module, so as to realize the integration of a display function and the touch function of the OLED display apparatus.

SUMMARY

In an aspect, an embodiment of the disclosure provides a display substrate, including: a base substrate, including a display region and a non-display region on a side of the display region; an encapsulation dam, located in the non-display region and arranged around the display region; an organic insulating layer, located on the base substrate; wherein the organic insulating layer has a groove structure, and the groove structure is located on one side of the encapsulation dam away from the display region; a touch structure, located on one side of the organic insulating layer facing away from the base substrate, where the touch structure includes a plurality of touch lines extending to the non-display region; and an inorganic insulating layer, on the base substrate, where the inorganic insulating layer has a hollowed-out structure on the side of the encapsulation dam away from the display region, and the hollowed-out structure covers the groove structure and does not overlap with orthographic projections of the plurality of touch lines.

In some embodiments, in the above display substrate provided by the embodiment of the disclosure, the touch structure further includes: a plurality of touch electrodes and a plurality of bridging portions located in the display region. Each touch line includes: a first part disposed in the same layer as the plurality of touch electrodes, and a second part disposed in the same layer as the plurality of bridging portions and electrically connected with the first part. The plurality of touch electrodes are electrically connected with the plurality of touch lines, and each bridging portion is electrically connected with two touch electrodes correspondingly; and the inorganic insulating layer is located between a layer where the plurality of touch electrodes are located and a layer where the plurality of bridging portions are located.

In some embodiments, in the above display substrate provided by the embodiment of the disclosure, the plurality of bridging portions are located between the layer where the plurality of touch electrodes are located and the organic insulating layer.

In some embodiments, the above display substrate provided by the embodiment of the disclosure further includes: at least one floating line located in the non-display region; and the plurality of touch lines may be divided into at least one group of touch lines, and the at least one floating line is located on at least one of two side edges of the at least one group of touch lines.

In some embodiments, in the above display substrate provided by the embodiment of the disclosure, the plurality of touch lines may be divided into two groups of touch lines, the at least one floating line is plural, and the plurality of floating lines are located on two side edges of each group of touch lines respectively.

In some embodiments, in the above display substrate provided by the embodiment of the disclosure, each group of touch lines is arranged in a first direction and extends in a second direction, the first direction intersects with the second direction, and the plurality of floating lines are located on the two side edges of each group of touch lines in the first direction respectively.

In some embodiments, in the above display substrate provided by the embodiment of the disclosure, the plurality of floating lines are arranged in at least one of the layer where the plurality of touch electrodes are located or the layer where the plurality of bridging portions are located.

In some embodiments, in the above display substrate provided by the embodiment of the disclosure, the plurality of floating lines include: a plurality of first floating lines disposed in the same layer as the plurality of touch electrodes, and a plurality of second floating lines disposed in the same layer as the plurality of bridging portions; and in a direction perpendicular to the base substrate, part of the first floating lines and the plurality of second floating lines are arranged correspondingly, and the rest of the first floating lines do not overlap with the plurality of second floating lines.

In some embodiments, in the above display substrate provided by the embodiment of the disclosure, a region where the part of the first floating lines are located is located between a region where the rest of the first floating lines are located and a region where the touch lines are located.

In some embodiments, in the above display substrate provided by the embodiment of the disclosure, the quantity of the rest of the first floating lines is greater than the quantity of the part of the first floating lines.

In some embodiments, in the above display substrate provided by the embodiment of the disclosure, orthographic projections of the plurality of second floating lines on the base substrate completely coincide with orthographic projections of the part of the first floating lines.

In some embodiments, in the above display substrate provided by the embodiment of the disclosure, orthographic projections of the part of the first floating lines on the base substrate are located in an orthographic projection of the inorganic insulating layer. An orthographic projection of part of a structure of at least one of the rest of the first floating lines on the base substrate overlaps with the hollowed-out structure and does not overlap with the groove structure, and the other part of the structure does not overlap with the hollowed-out structure.

In some embodiments, in the above display substrate provided by the embodiment of the disclosure, in the first direction, a first distance between every two adjacent floating lines, a second distance between every two adjacent touch lines and a third distance between the floating lines and the touch lines which are adjacent are the same.

In some embodiments, in the above display substrate provided by the embodiment of the disclosure, the first distance, the second distance and the third distance are 4 μm-25 μm.

In some embodiments, in the above display substrate provided by the embodiment of the disclosure, the plurality of floating lines extend from edges of one sides of the plurality of touch lines close to the display region to be flush with ends of one sides of the plurality of touch lines away from the display region.

In some embodiments, in the above display substrate provided by the embodiment of the disclosure, the quantity of the plurality of floating lines on two sides of each group of touch lines is the same.

In some embodiments, in the above display substrate provided by the embodiment of the disclosure, the plurality of touch lines include a plurality of touch driving lines and a plurality of touch sensing lines. The plurality of touch electrodes include: a plurality of touch driving electrodes arranged in the first direction, and a plurality of touch sensing electrodes arranged in the second direction; and each touch driving line is electrically connected with one row of touch driving electrodes, and each touch sensing line is electrically connected with one column of touch sensing electrodes.

In some embodiments, in the above display substrate provided by the embodiment of the disclosure, the organic insulating layer includes: a planarization layer, and a pixel defining layer located on one side of the planarization layer facing away from the base substrate.

In some embodiments, in the above pattern recognition module provided by the embodiment of the disclosure, the planarization layer is of a single-layer structure or a double-layer structure.

In another aspect, an embodiment of the disclosure provides a display panel, including the above display substrate provided by the embodiment of the disclosure.

In another aspect, an embodiment of the disclosure provides a display apparatus, including the above display panel provided by the embodiment of the disclosure.

DETAILED DESCRIPTION

Figure 1:
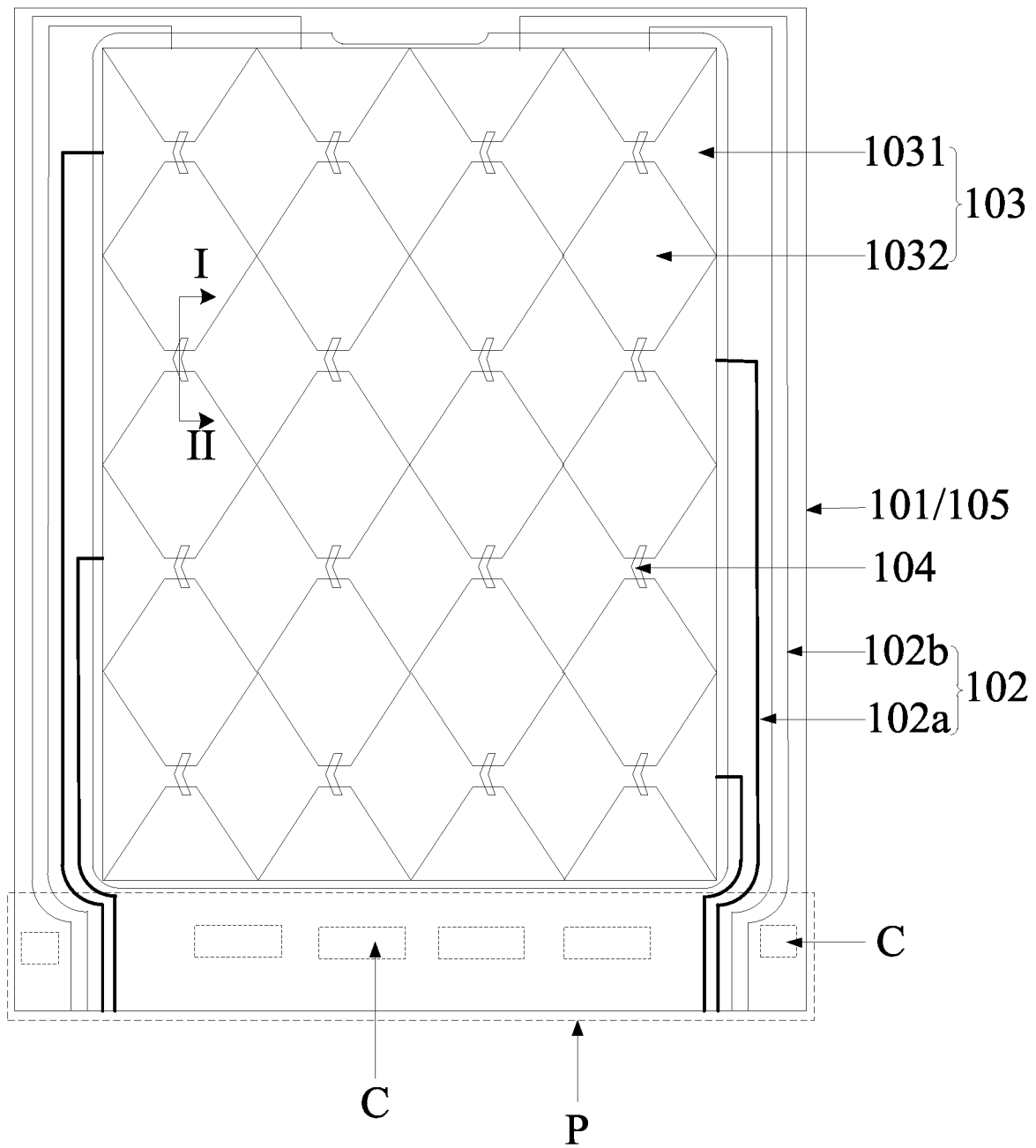
FIG. 1 is a schematic structural diagram of a display panel in the related art.

To make objectives, technical solutions and advantages of embodiments of the disclosure clearer, the technical solutions of the embodiments of the disclosure will be clearly and completely described below in conjunction with accompanying drawings of the embodiments of the disclosure. It needs to be noted that sizes and shapes of all figures in the accompanying drawings do not reflect true scales, and are only intended to schematically illustrate the content of the disclosure. The same or similar reference numerals represent the same or similar elements or elements with the same or similar functions all the time. Apparently, the described embodiments are only a part of the embodiments of the disclosure, not all of the embodiments. Based on the described embodiments of the disclosure, all other embodiments obtained by those ordinarily skilled in the art without creative work shall fall within the protection scope of the disclosure.

Unless otherwise indicated, technical or scientific terms used herein shall have the ordinary meanings understood by those ordinarily skilled in the art to which the disclosure pertains. The words "first", "second" and similar words used in specification and claims of the disclosure do not indicate any order, quantity or importance, but are only used to distinguish different components. The words "comprise" or "include" and the like indicate that an element or item appearing before such word covers listed elements or items appearing after the word and equivalents thereof, and does not exclude other elements or items. "Inner", "outer", "upper" and "lower" and the like are only used to represent relative position relationships, and the relative position relationships may also change accordingly after an absolute position of a described object is changed.

Figure 2:
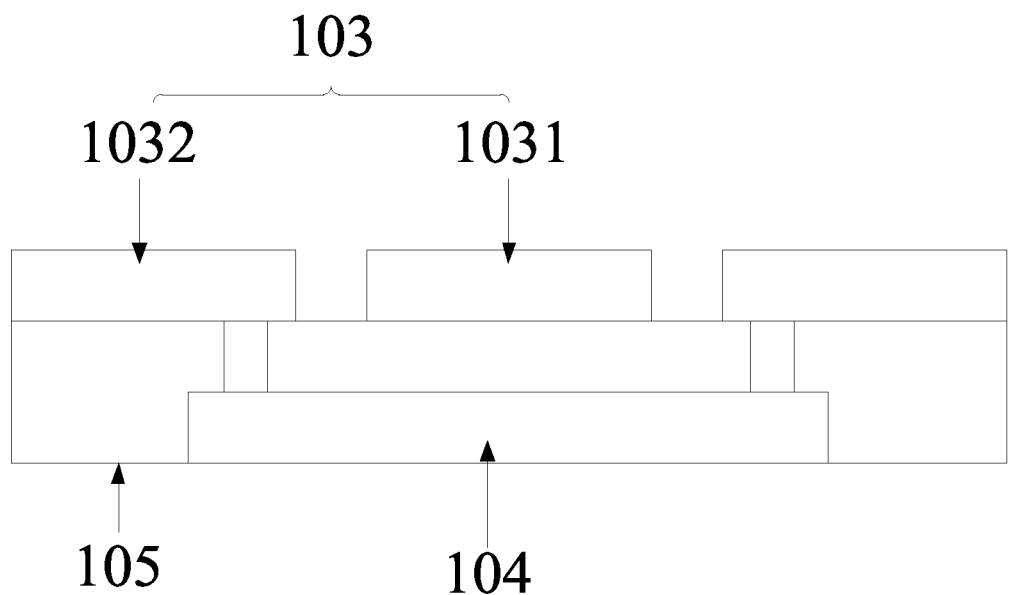
FIG. 2 is a schematic cross-sectional view along a line I-II in FIG. 1.
Figure 3:
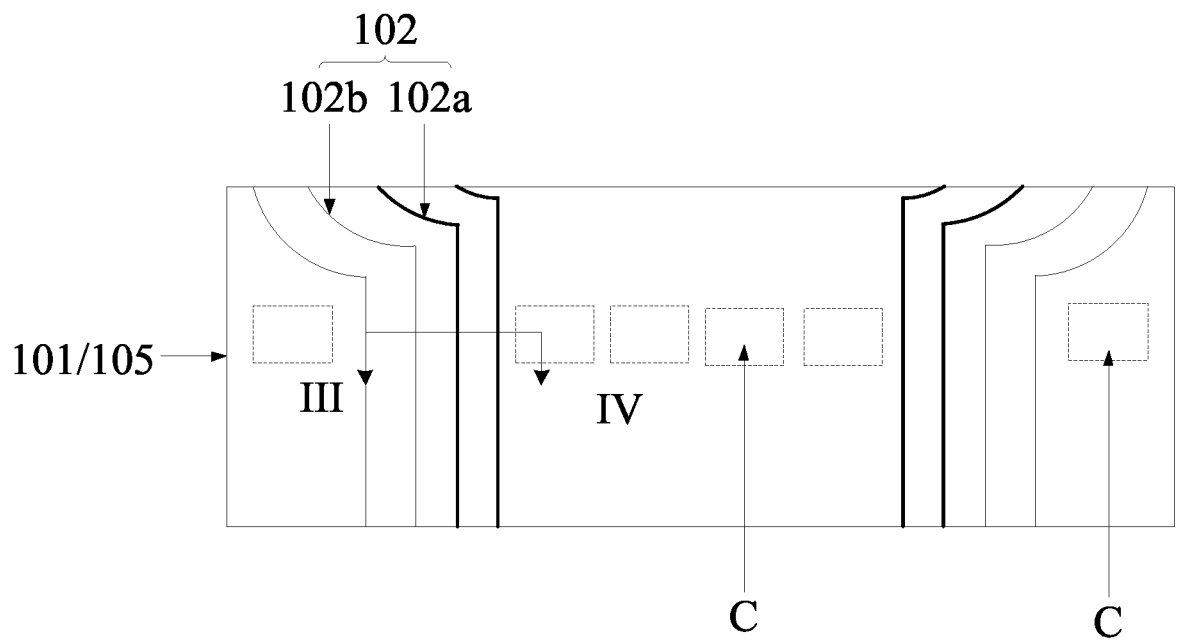
FIG. 3 is a schematic enlarged view of a region P in FIG. 1.
Figure 4:
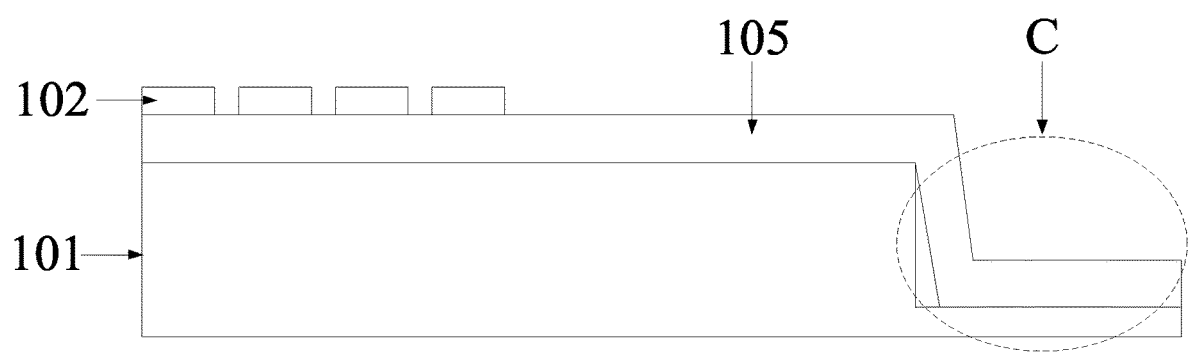
FIG. 4 is a schematic cross-sectional view along a line III-IV in FIG. 3.

At present, mainstream small-size OLED products in the market are large-angle bending products equipped with a touch structure process (TSP) inside. As shown in FIG. 1 to FIG. 3, in a related OLED product equipped with a touch structure inside, the touch structure is in contact with an encapsulation layer of an OLED display module in a display region, and is in contact with an organic insulating layer 101 which is arranged on a whole surface in the OLED display module in a bezel region around the display region. The touch structure includes a plurality of touch lines 102, a plurality of touch electrodes 103, a plurality of bridging portions 104, and an inorganic insulating layer 105 all over a whole surface between a layer where the plurality of touch electrodes 103 are located and a layer where the plurality of bridging portions 104 are located. In order to release a bending stress in a large-angle bending process, a groove structure C needs to be arranged in the organic insulating layer 101 of the bezel region. In order to ensure that there is no crack under large-angle bending, a film stress of the inorganic insulating layer 105 in the touch structure needs to be increased. However, the large film stress reduces adhesion between the inorganic insulating layer 105 and the organic insulating layer 101 at the groove structure C (as shown in FIG. 4), resulting in wrinkling or peeling of the inorganic insulating layer 105 in a bending region, then resulting in breaking of the touch lines 102 and foreign particles being out of limit in the process, and serious poor touch insensitivity is induced.

Figure 5:
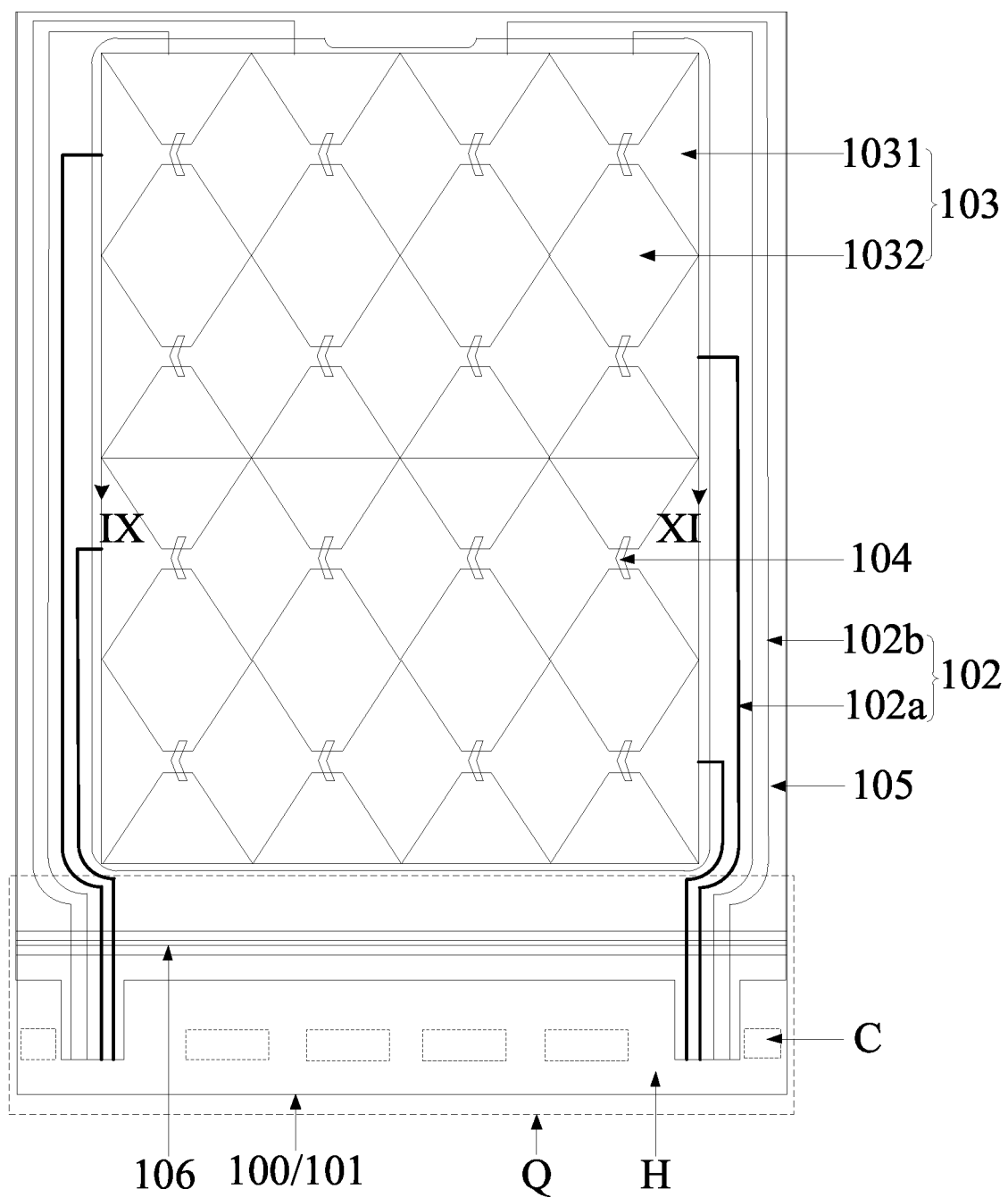
FIG. 5 is a schematic structural diagram of a display panel provided by an embodiment of the disclosure.
Figure 6:
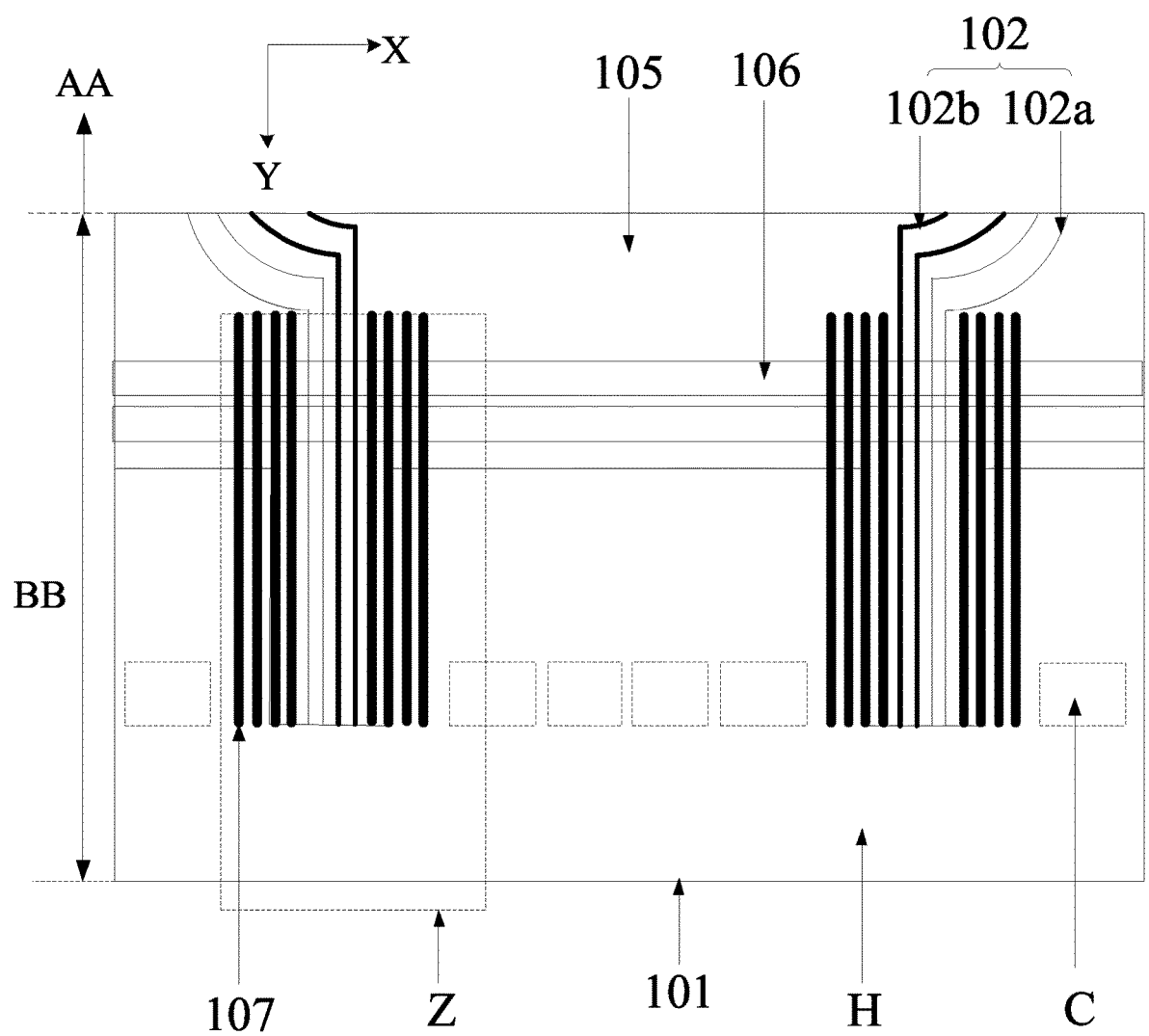
FIG. 6 is a schematic enlarged view of a region Q in FIG. 5.

In view of the above problems existing in the related art, an embodiment of the disclosure provides a display substrate, as shown in FIG. 5 and FIG. 6, including:

a base substrate 100, including a display region AA and a non-display region BB located on a side of the display region AA;

an encapsulation dam 106, located in the non-display region BB and arranged around the display region AA;

an organic insulating layer 101, on the base substrate 100, where the organic insulating layer 101 has a groove structure C, and the groove structure C is located at a side of the encapsulation dam 106 facing away from the display region AA;

a touch structure, on a side of organic insulating layer 101 facing away from the base substrate 100, where the touch structure includes a plurality of touch lines 102 extending to the non-display region BB; and an inorganic insulating layer 105, on the base substrate 100, where the inorganic insulating layer 105 has a hollowed-out structure H on the side of the encapsulation dam 106 facing away from the display region AA, and the hollowed-out structure H covers the groove structure C and does not overlap with orthographic projections of the plurality of touch lines 102.

In the above display substrate provided by the embodiment of the disclosure, the hollowed-out structure H covering the groove structure C contained in the organic insulating layer 101 is arranged in the inorganic insulating layer 105, so that there is no pattern of the inorganic insulating layer 105 in a region where the groove structure C is located, and wrinkling or peeling of the inorganic insulating layer 105 with a large stress at the groove structure C is avoided. In addition, the hollowed-out structure H does not cover the touch lines 102, so that the inorganic insulating layer 105 located at the touch lines 102 may maintain good adhesion of the touch lines 102. Therefore, in the disclosure, a product yield is effectively improved, and a touch effect is ensured.

In some embodiments, a length and/or a width of the hollowed-out structure H are/is greater than a length and/or a width of the groove structure C respectively. Specifically, when there are a plurality of groove structures C, in some embodiments, a plurality of hollowed-out structures H covering all groove structures C respectively may be arranged in the inorganic insulating layer 105, and in this case, the length and/or the width of each hollowed-out structure H are/is greater than the length and/or the width of the corresponding groove structure C. In some other embodiments, one hollowed-out structure H may be arranged to cover a plurality of groove structures C simultaneously, and in this case, the length and/or the width of each hollowed-out structure H need/needs to be greater than a sum of the lengths and/or a sum of the widths of the plurality of groove structures C.

In some embodiments, a boundary distance between the hollowed-out structure H and the side of the encapsulation dam 106 facing away from the display region AA is greater than the width of the groove structure C, and/or is smaller than the length of the groove structure C.

In some embodiments, a ratio of the length to the width of the groove structure C is in a range from about 20:1 to about 200:1. In some other embodiments, the ratio of the length to the width of the groove structure C may be about 22:1, about 169:1, or about 185:1. It can be understood that the "about" herein allows an error within an allowable process and measurement range, which is not strictly limited, and may vary within a fluctuation of plus or minus 10%.

In some embodiments, a ratio of the width to a depth of the groove structure C is in a range from about 5:1 to about 20:1. In some other embodiments, the ratio of the width to the depth of the groove structure C may be 13.5:1. In some embodiments, the width of the groove structure C is about 55 µm, the depth is about 4 µm, and the length is about 1235 µm, 9300 µm or 10200 µm. The boundary distance between the hollowed-out structure H and the side of the encapsulation dam 106 away from the display region AA (namely, a shortest distance between the encapsulation dam 106 and a boundary of the inorganic insulating layer 105) is about 165 µm, and a depth is about 0.53 µm. A longest distance between the encapsulation dam 106 and the boundary of the inorganic insulating layer 105 is about 515 µm.

In some embodiments, in the above display substrate provided by the embodiment of the disclosure, as shown in FIG. 5 to FIG. 11, the touch structure may further include: a plurality of touch electrodes 103 and a plurality of bridging portions 104 in the display region AA.

Each touch line 102 includes: a first part 1021 disposed in the same layer as the plurality of touch electrodes 103, and a second part 1022 disposed in the same layer as the plurality of bridging portions 104 and electrically connected with the first part 1021.

The plurality of touch electrodes 103 are electrically connected with the plurality of touch lines 102, and each bridging portion 104 is electrically connected with two touch electrodes 103 correspondingly.

The inorganic insulating layer 105 is disposed between the layer where the plurality of touch electrodes 103 are located and the layer where the plurality of bridging portions 104 are located.

The touch lines 102 are arranged as double-layer lines including the first parts 1021 and the second parts 1022, so that the touch electrodes 103 may still be loaded with signals through the other layer of lines after one layer of lines are partially broken, and thus the problem that the single-layer lines are broken, which is prone to causing touch failure is effectively solved. During specific implementation, the first parts 1021 and the second parts 1022 are electrically connected through via holes running through the inorganic insulating layer 105.

It should be noted that in the disclosure, the touch structure may be not only the above mutual capacitive structure, but also a self-capacitive structure. In addition, when the touch structure is the self-capacitive structure, the touch structure may include a plurality of self-capacitive electrodes disposed on a layer different from the plurality of touch lines 102, the inorganic insulating layer 105 is located between the layer where the plurality of touch lines 102 are located and a layer where the plurality of self-capacitive electrodes are located. Each touch line 102 is electrically connected with a self-capacitive electrode through a via hole running through the inorganic insulating layer 105. The following will take the touch structure being the mutual capacitive structure as an example for illustration.

In some embodiments, in the above display substrate provided by the embodiment of the disclosure, the plurality of bridging portions 104 may be located between the layer where the plurality of touch electrodes 103 are located and the organic insulating layer 101, that is, the layer where the plurality of bridging portions 104 are located, the inorganic insulating layer 105 and the layer where the plurality of touch electrodes 103 are located are sequentially disposed on one side of the organic insulating layer 101 facing away from the base substrate 100 in a stacked mode. Of course, during specific implementation, the plurality of bridging portions 104 may further be disposed on one side of the layer where the plurality of touch electrodes 103 are located facing away from the organic insulating layer 101, and in this case, the layer where the plurality of touch electrodes 103 are located, the inorganic insulating layer 105 and the layer where the plurality of bridging portions 104 are located are sequentially disposed on a side of the organic insulating layer 101 facing away from the base substrate 100 in a stacked mode. The following takes the plurality of bridging portions 104 being located between the layer where the plurality of touch electrodes 103 are located and the organic insulating layer 101 as an example for illustration.

Figure 12:
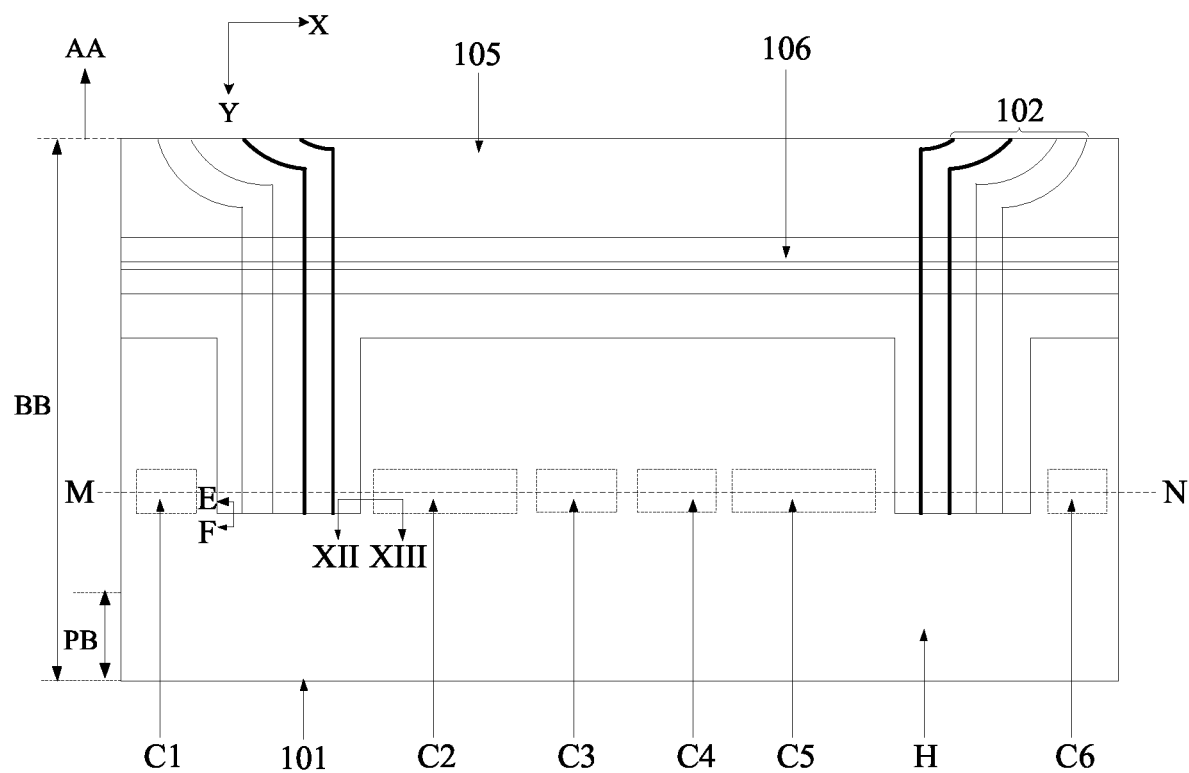
FIG. 12 is another schematic enlarged view of the region Q in FIG. 5.

In some embodiments, as shown in FIG. 12, there are 6 groove structures C, which are distributed in a first direction X from one side to the other side of the display substrate, and sequentially are a first groove structure C1, a second groove structure C2, a third groove structure C3, a fourth groove structure C4, a fifth groove structure C5 and a sixth groove structure C6. In some embodiments, positions of all groove structures C are roughly in a straight line. Taking two groups of touch lines 102 as an example for illustration, the first groove structure C1 and the sixth groove structure C6 are located at two sides of a whole of the two groups of touch lines 102, and the second groove structure C2, the third groove structure C3, the fourth groove structure C4 and the fifth groove structure C5 are located between the two groups of touch lines 102. In some other embodiments, the widths and/or the depths of the groove structures C are roughly the same. In some embodiments, the lengths of the outermost groove structures C (such as the first groove structure C1 and the sixth groove structure C6) are smallest. Between the two groups of touch lines 102, the lengths of the groove structures C close to the two groups of touch lines 102 (such as the second groove structure C2 and the fifth groove structure C5) are greater than the lengths of the groove structures C away from the two groups of touch lines 102 (such as the third groove structure C3 and the fourth groove structure C4). The width of each groove structure C is symmetrical with respect to a virtual central line MN.

It should be noted that in an actual process, due to limitations of process conditions or other factors, the above "roughly the same" may be completely the same, and may have some deviations. Therefore, a relationship of "roughly the same" among the above features, as long as the error tolerance is met, belongs to the scope of protection of the disclosure. In addition, as shown in FIG. 12, there is also a bending region PB in the non-display region BB, and further, the groove structure C is located between the encapsulation dam 106 and the bending region PB.

In some embodiments, the above display substrate provided by the embodiment of the disclosure, as shown in FIG. 6 to FIG. 11, may further include: at least one floating line 107 in the non-display region BB; and the plurality of touch lines 102 may be divided into at least one group of touch lines 102, and the at least one floating line 107 is located on at least one of two sides of the at least one group of touch lines 102. In some embodiments, the plurality of touch lines 102 may only form one group, and in some other embodiments, the plurality of touch lines 102 may be divided into two groups, which may be arranged according to the actual bezel size of a product and the quantity of the touch lines 102, and is not specifically limited here. In addition, since the inorganic insulating layer 105 located on an edge of each group of touch lines 102 is prone to wrinkling or even peeling from the organic insulating layer 101, the floating line 107 is arranged on the edge of each group of touch lines 102, so that the situation that a peeling phenomenon of the inorganic insulating layer 105 extends to the region where the touch lines 102 are located, resulting in poor touch, may be effectively prevented.

In some embodiments, in the above display substrate provided by the embodiment of the disclosure, as shown in FIG. 7 to FIG. 11, the plurality of touch lines 102 may be divided into two groups of touch lines 102, the above at least one floating line 107 are plural, and the plurality of floating lines 107 may be located at the two sides of each group of touch lines 102 respectively. The floating lines 107 are arranged at the two sides of each group of touch lines 102, so that the situation that the peeling phenomenon of the inorganic insulating layer 105 extends to the region where the touch lines 102 are located and thus resulting in poor touch, may be more effectively prevented.

In some embodiments, in the above display substrate provided by the embodiment of the disclosure, as shown in FIG. 6, each group of touch lines 102 is arranged in a first direction X and extends in a second direction Y, the first direction X intersects with the second direction Y. The plurality of floating lines 107 are located at the two sides of each group of touch lines 102 in the first direction X respectively. Since the inorganic insulating layer 105 located on the two sides of each group of touch lines 102 is prone to wrinkling or even peeling from the organic insulating layer 101, the floating lines 107 are arranged at the two sides of each group of touch lines 102, so that the situation that the peeling phenomenon of the inorganic insulating layer 105 extends to the region where the touch lines 102 are located and thus resulting in poor touch may be effectively prevented.

It should be noted that in the disclosure, in order to prevent the floating lines 107 from interfering with signals on the touch lines 102, the floating lines 107 may be arranged not to access any signal.

Figure 7:
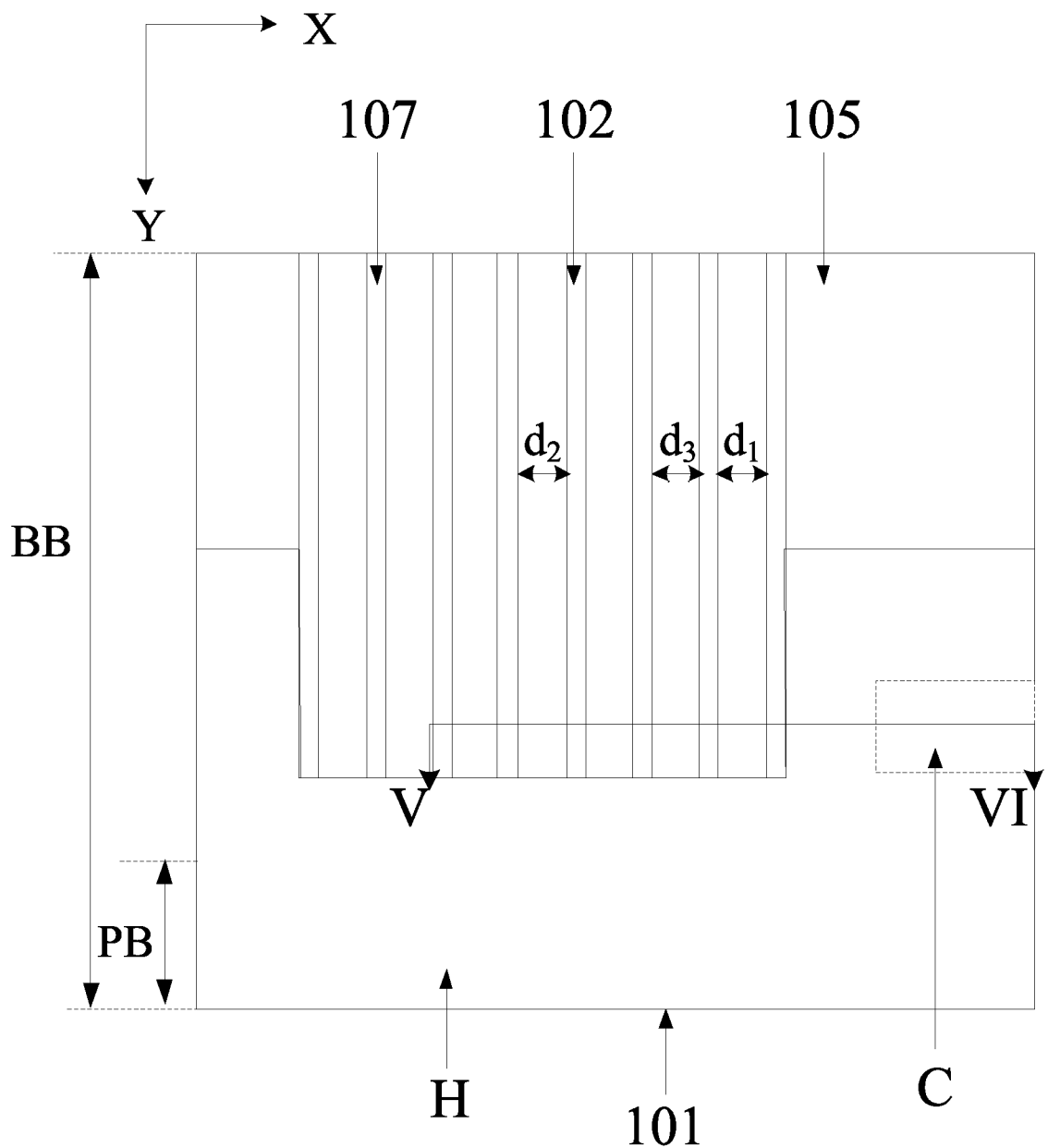
FIG. 7 is a schematic enlarged view of a region Z in FIG. 6.
Figure 9:
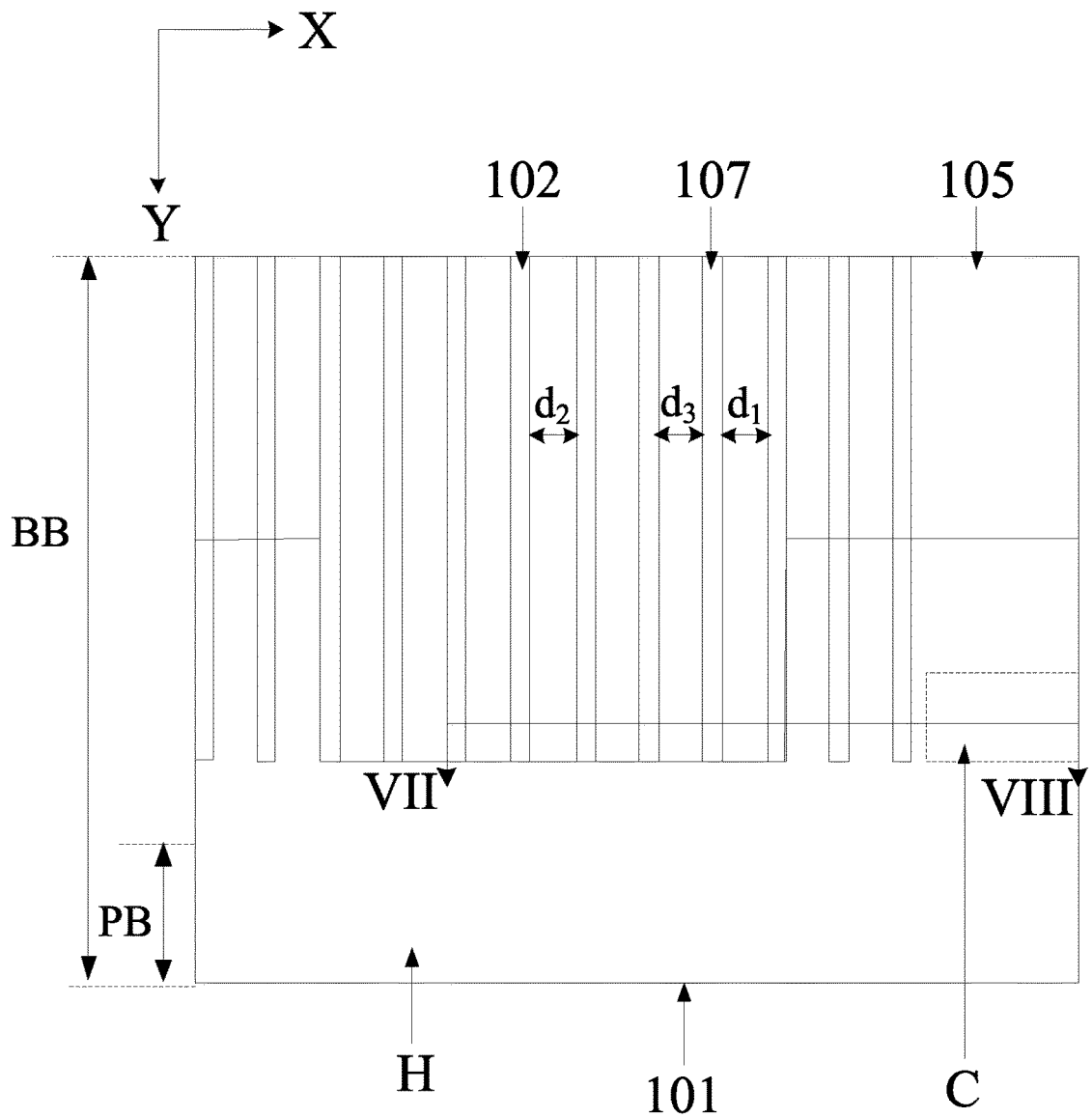
FIG. 9 is another schematic enlarged view of the region Z in FIG. 6.

In some embodiments, in the above display substrate provided by the embodiment of the disclosure, in order to effectively prevent the peeling phenomenon of the inorganic insulating layer 105 from extending to the region where the touch lines 102 are located, the quantity of the plurality of floating lines 107 at two sides of each group of touch lines 102 may be set to be the same, as shown in FIG. 7 and FIG. 9.

In some embodiments, in the above display substrate provided by the embodiment of the disclosure, as shown in FIG. 7 to FIG. 11, the plurality of floating lines 107 may be of a single-layer or double-layer structure, and the film layer structure thereof may be the same as at least one of the layer where the plurality of touch electrodes 103 are located or the layer where the plurality of bridging portions 104 are located in layer and material.

The inorganic insulating layer 105 is located between the layer where the plurality of touch electrodes 103 are located and the layer where the plurality of bridging portions 104 are located, therefore, the floating lines 107 are arranged on the layer where the plurality of touch electrodes 103 are located or the layer where the plurality of bridging portions 104 are located, which may both effectively prevent the peeling of the inorganic insulating layer 105. The floating lines 107 are arranged in both the layer where the plurality of touch electrodes 103 are located and the layer where the plurality of bridging portions 104 are located, a double-layer reinforcement effect on the inorganic insulating layer 105 may be realized, and thus the peeling of the inorganic insulating layer 105 is better prevented.

Figure 8:
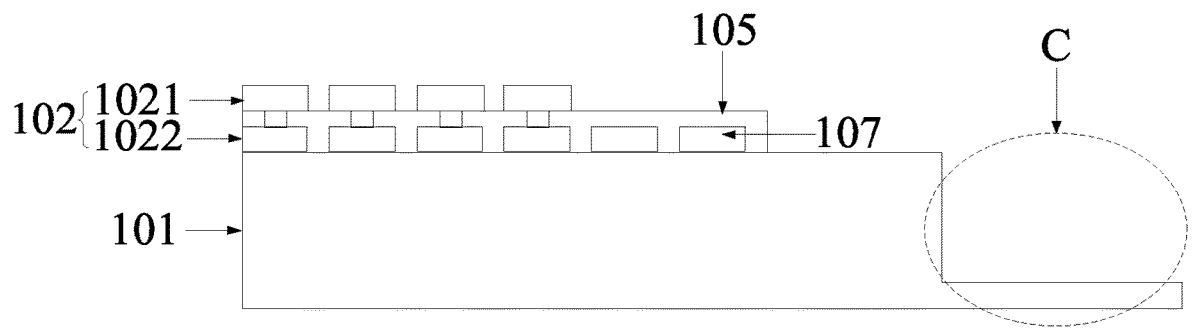
FIG. 8 is a schematic cross-sectional view along a line V-VI in FIG. 7.
Figure 10:
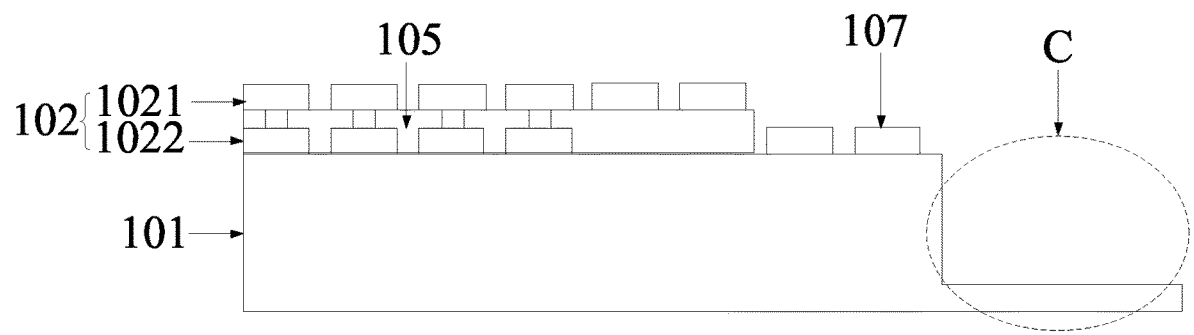
FIG. 10 is a schematic cross-sectional view along a line VII-VIII in FIG. 9.
Figure 11:
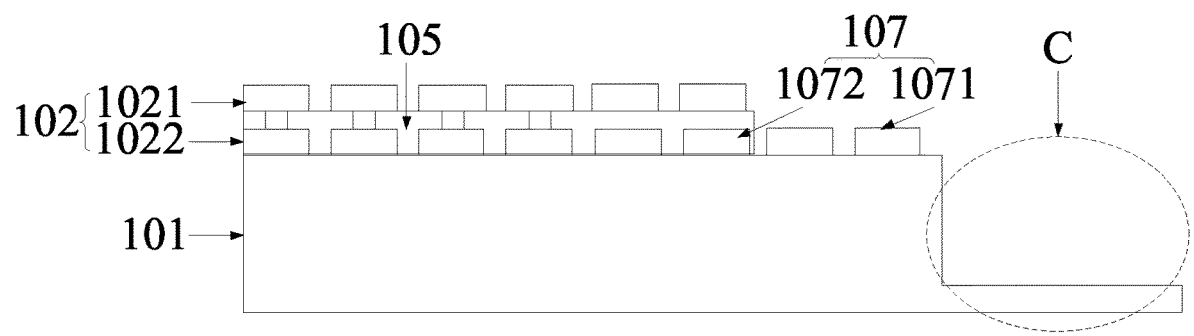
FIG. 11 is another schematic cross-sectional view along the line VII-VIII in FIG. 9.

In some embodiments, in the above display substrate provided by the embodiment of the disclosure, in order to effectively prevent the peeling of the inorganic insulating layer 105, as shown in FIG. 7 and FIG. 8, when the plurality of floating lines 107 are disposed in the same layer as the plurality of bridging portions 104, orthographic projections of the plurality of floating lines 107 on the base substrate 100 are located in an orthographic projection of the inorganic insulating layer 105 on the base substrate 100; as shown in FIG. 9 and FIG. 10, when the plurality of floating lines 107 are disposed in the same layer as the plurality of touch electrodes 103, orthographic projections of part of the floating lines 107 on the base substrate 100 are located in the orthographic projection of the inorganic insulating layer 105 on the base substrate 100, and orthographic projections of the rest of the floating lines 107 on the base substrate 100 overlap with an orthographic projection of the hollowed-out structure H, and do not overlap with an orthographic projection of the groove structure C. As shown in FIG. 9 and FIG. 11, when the plurality of floating lines 107 include: a plurality of first floating lines 1071 disposed in the same layer as the plurality of touch electrodes 103 and a plurality of second floating lines 1072 disposed in the same layer as the plurality of bridging portions 104, in a direction perpendicular to the base substrate 100, part of the first floating lines 1071 and all the second floating lines 1072 are arranged correspondingly, and the rest of the first floating lines 1071 do not overlap with all the second floating lines 1072.

In some embodiments, in the above display substrate provided by the embodiment of the disclosure, in order to enhance a reinforcement effect on the inorganic insulating layer 105, a region where the above mentioned part of the first floating lines 1071 are located may be arranged to be located between a region where the above mentioned rest of the first floating lines 1071 are located and the region where the touch lines 102 are located. In other words, double-layer floating lines (the part of the first floating lines 1071 and all the second floating lines 1072 respectively) are arranged in a region close to the touch lines 102, and single-layer floating lines (namely the rest of the first floating lines 1071) are arranged in a region away from the touch lines 102. Further, the quantity of the rest of the first floating lines 1071 contained in the single-layer floating lines may be greater than the quantity of the part of the first floating lines 1071 contained in the double-layer floating lines.

In some embodiments, in the above display substrate provided by the embodiment of the disclosure, orthographic projections of the part of the first floating lines 1071 on the base substrate 100 are located in the orthographic projection of the inorganic insulating layer 105. An orthographic projection of part of a structure of at least one of the rest of the first floating lines 1071 on the base substrate 100 overlaps with the hollowed-out structure H, and does not overlap with the groove structure C, and the other part of the structure of at least one of the rest of the first floating lines 1071 on the base substrate 100 does not overlap with the hollowed-out structure H. In this way, there is the inorganic insulating layer 105 between the part of the first floating lines 1071 and all the second floating lines 1072, which avoids direct overlapping of the first floating lines 1071 and the second floating lines 1072 which are arranged correspondingly, so that the problem of peeling caused by poor overlapping adhesion of double-layer metal is solved.

In some embodiments, in the above display substrate provided by the embodiment of the disclosure, in order to ensure the double-layer reinforcement effect on the inorganic insulating layer 105, the orthographic projections of the part of the first floating lines 1071 on the base substrate 100 may be set to roughly and completely coincide with the orthographic projections of all the second floating lines 1072. Specifically, "roughly and completely coincide" means that the first floating lines 1071 just block the corresponding second floating lines 1072, or the first floating lines 1071 block most (such as blocking 90%-99%) of the corresponding second floating lines 1072. In some embodiments, the orthographic projections of the part of the first floating lines 1071 on the base substrate 100 completely coincide with the orthographic projections of all the second floating lines 1072.

In some embodiments, part of the structure of at least one of the rest of the first floating lines 1071 has an overlapping area with the inorganic insulating layer 105, and the connected other part of the structure has no overlapping area with the inorganic insulating layer 105, that is, it is located in the hollowed-out structure H. At least one of the rest of the first floating lines 1071 has a smooth section difference transition from the case with the inorganic insulating layer 105 to a case without the inorganic insulating layer 105, which may further improve the adhesion of the floating lines 107 to the film layer under the hollowed-out structure H and the inorganic insulating layer 105.

In some embodiments, in the above display substrate provided by the embodiment of the disclosure, as shown in FIG. 7 and FIG. 9, in the first direction X, a first distance $d_1$ between every two adjacent floating lines 107, a second distance $d_2$ between every two adjacent touch lines 102 and a third distance $d_3$ between the floating lines 107 and the touch lines 102 which are adjacent are the same. In some embodiments, the first distance $d_1$, the second distance $d_2$ and the third distance $d_3$ may be 4 μm-25 μm, such as, 4 μm, 5 μm, 6 μm, 7 μm, 8 μm, 9 μm, 10 μm, 11 μm, 12 μm, 13 μm, 14 μm, 15 μm, 16 m, 17 μm, 18 μm, 19 μm, 20 μm, 21 μm, 22 μm, 23 μm, 24 μm, or 25 μm.

By setting the first distance $d_1$ between the floating lines 107 and the third distance $d_3$ between the floating lines 107 and the touch lines 102 to be equal to the second distance $d_2$ between the touch lines 102, the floating lines 107 may be manufactured by the same process as the touch lines 102, so that the process uniformity is ensured, and an adverse effect of the process fluctuation caused by the manufacturing of the floating lines 107 on the touch lines 102 is avoided.

In some embodiments, in the above display substrate provided by the embodiment of the disclosure, as shown in FIG. 6, FIG. 7 and FIG. 9, the plurality of floating lines 107 extend from edges of one sides of the plurality of touch lines 102 close to the display region AA to be flush with ends of one sides of the plurality of touch lines 102 away from the display region AA. In some embodiments, the plurality of floating lines 107 and the plurality of touch lines 102 all cross the encapsulation dam 106, and ends of one sides of the two away from the display region AA are flush with a lower boundary of the inorganic insulating layer 105 adjacent to the bending region PB, as shown in FIG. 6. In this way, the floating lines 107 may be long, so that a bending resistance of the floating lines 107 is improved, and the reinforcement effect on the inorganic insulating layer 105 may be better realized. In addition, when the rest of the first floating lines 1071 being in direct contact with the organic insulating layer 101 in a region outside the groove structure C covered by the hollowed-out structure H extend to the edges of the sides of the plurality of touch lines 102 away from the display region AA, the rest of the first floating lines 1071 are in direct contact with the inorganic insulating layer 105 at the edges of the sides of the plurality of touch lines 102 away from the display region AA, so that adhesion between the inorganic insulating layer 105 and the organic insulating layer 101 may be increased, and the reinforcement effect on the inorganic insulating layer 105 is further improved.

In some embodiments, in the above display substrate provided by the embodiment of the disclosure, as shown in FIG. 5, the plurality of touch lines 102 specifically may include a plurality of touch driving lines 102a and a plurality of touch sensing lines 102b;

the plurality of touch electrodes 103 may include: a plurality of touch driving electrodes 1031 arranged in the first direction X, and a plurality of touch sensing electrodes 1032 arranged in the second direction Y; and each touch driving line 102a is electrically connected with one row of touch driving electrodes 1031, and each touch sensing line 102b is electrically connected with one column of touch sensing electrodes 1032.

Figure 13:
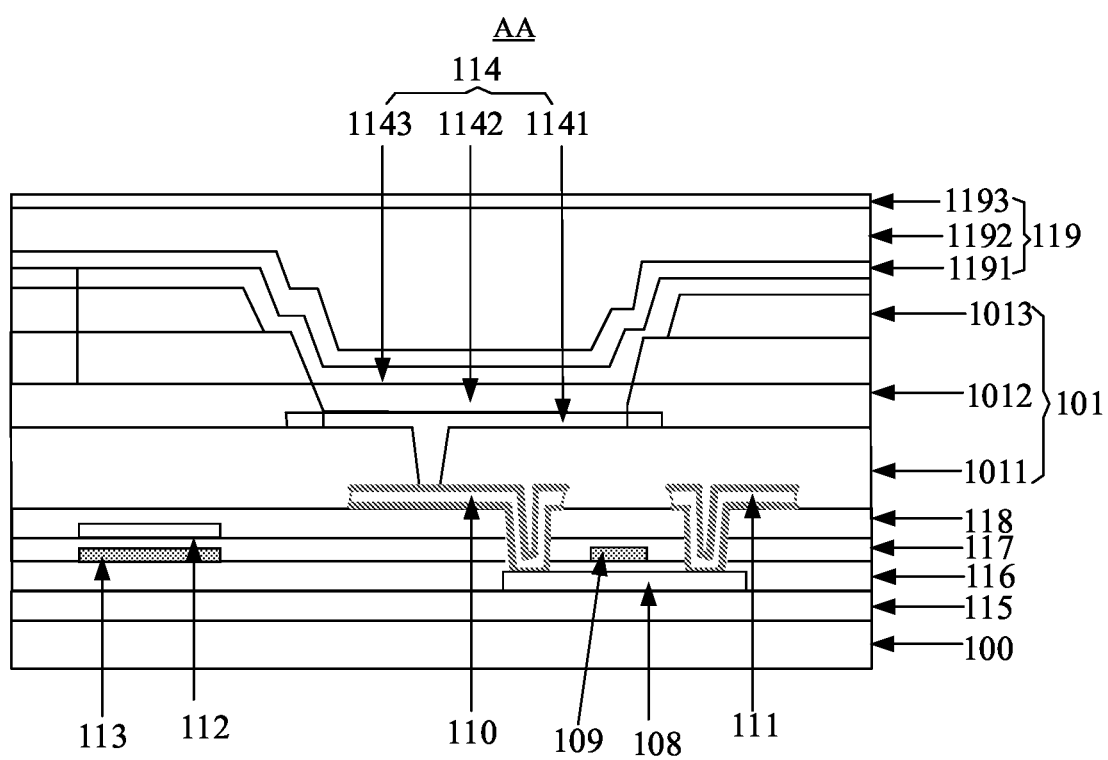
FIG. 13 is a schematic cross-sectional view along a line IX-XI in FIG. 5.
Figure 14:
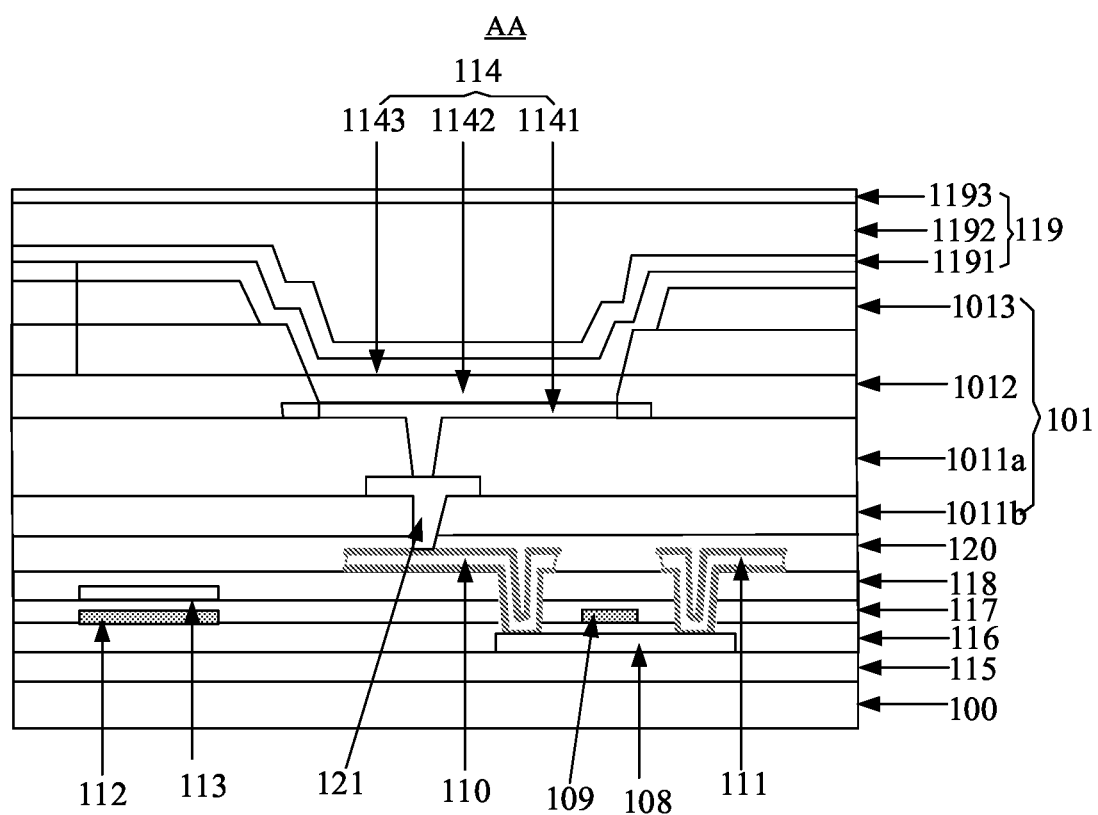
FIG. 14 is another schematic cross-sectional view along the line IX-XI in FIG. 5.

In some embodiments, in the above display substrate provided by the embodiment of the disclosure, as shown in FIG. 13, the organic insulating layer 101 may include: a planarization layer 1011, and a pixel defining layer 1012 on a side of the planarization layer 1011 facing away from the base substrate 100. In some embodiments, the planarization layer 1011 may be of a single-layer structure shown in FIG. 13, or a double-layer structure shown in FIG. 14. In addition, when the planarization layer 1011 is of the double-layer structure, the planarization layer may include a first planarization layer 1011a and a second planarization layer 1011b, as shown in FIG. 14. In this case, the encapsulation dam 106 may include: a protective portion in the planarization layer 1011 and a barrier portion in the pixel defining layer 1012. In some embodiments, as shown in FIG. 13, the organic insulating layer 101 may further include: a spacer layer 1013 on a side of the pixel defining layer 1012 facing away from the planarization layer 1011. In this case, the encapsulation dam 106 may include: a protective portion in the planarization layer 1011, a barrier portion in the pixel defining layer 1012, and a supporting portion in the spacer layer 1013.

In some other embodiments, the encapsulation dam is not limited to the above film layer structure, and may include at least one layer of structure disposed in the same layer as the film layer in the display region. The encapsulation dam may include at least one, for example, may be two or more. The film layer composition of each encapsulation dam may be the same or different, the quantity of the film layer may be the same or different, and a height may be the same or different.

In some embodiments, the groove structure C may be formed on the pixel defining layer 1012 and the first planarization layer 1011a to expose part of a surface of the second planarization layer 1011b, or may also be further formed on the second planarization layer 1011b.

It should be noted that in the disclosure, at least one encapsulation dam 106 may be included, when there are a plurality of encapsulation dams 106, the groove structure C is also arranged between the adjacent encapsulation dams 106, however, since the groove structure C between the adjacent encapsulation dams 106 is far from the bending region, the adhesion between the inorganic insulating layer 105 and the organic insulating layer 101 may not be affected. Therefore, it is not necessary to excavate the inorganic insulating layer 105 in the region corresponding to the groove structure C between the adjacent encapsulation dams 106. Of course, in some embodiments, a part of the inorganic insulating layer 105 corresponding to the groove structure C between the adjacent encapsulation dams 106 may also be excavated according to actual needs, which is not limited here.

In some embodiments, as shown in FIG. 8 and FIG. 12, an edge of one side of the groove structure C in the organic insulating layer 101 closest to the display region AA is not flush with an edge of one side of the hollowed-out structure H in the inorganic insulating layer 105 closest to the display region AA, that is, the two edges form a stepped structure. In some embodiments, as shown in FIG. 8 and FIG. 12, an end surface of the side of the groove structure C in the organic insulating layer 101 closest to the display region AA is not flush with an end surface of the side of the hollowed-out structure H in the inorganic insulating layer 105 closest to the display region AA, that is, the two end surfaces form a stepped structure. In some embodiments, the organic insulating layer 101 has part of the surface exposed by the inorganic insulating layer 105 on one side of the encapsulation dam 106 away from the display region AA, that is, the inorganic insulating layer 105 neither covers the groove structure C in the organic insulating layer 101, nor covers part of the organic insulating layer 101 on one side of the groove structure C close to the display region AA.

In some embodiments, a shortest distance between the encapsulation dam 106 and a boundary of the inorganic insulating layer 105 is smaller than a shortest distance between the encapsulation dam 106 and a boundary of the organic insulating layer 101 (a boundary of one side of the groove structure C closest to the display region AA). In some embodiments, the shortest distance between the encapsulation dam 106 and the boundary of the inorganic insulating layer 101 (the boundary of the side of the groove structure C closest to the display region AA) is smaller than a shortest distance between the encapsulation dam 106 and a boundary of one side of the bending region PB closest to the display region AA. In some embodiments, a longest distance between the encapsulation dam 106 and the boundary of the inorganic insulating layer 105 is greater that the shortest distance between the encapsulation dam 106 and the boundary of the organic insulating layer 101 (the boundary of the side of the groove structure C closest to the display region AA). In some embodiments, the longest distance between the encapsulation dam 106 and the boundary of the inorganic insulating layer 105 is smaller than the shortest distance between the encapsulation dam 106 and the boundary of the side of the bending region PB closest to the display region AA.

In some embodiments, the above display substrate provided by the embodiment of the disclosure, as shown in FIG. 13 and FIG. 14, may further include: a plurality of pixel driving circuits located between the base substrate 100 and the organic insulating layer 101, each pixel driving circuit may include a transistor and a capacitor. The transistor includes an active layer 108, a gate 109, a source 110 and a drain 111, and the capacitor includes a first capacitive electrode 112 and a second capacitive electrode 113. The display substrate may further include a plurality of light emitting devices 114 located between the organic insulating layer 101 and the layer where the plurality of touch lines 102 are located. Each light emitting device 114 includes an anode 1141, a light emitting function layer 1142 and a cathode 1143, specifically, the plurality of pixel driving circuits and the plurality of light emitting devices 114 are all located in the display region AA, and the plurality of pixel driving circuits and the plurality of light emitting devices 114 are correspondingly and electrically connected. In some embodiments, the light emitting function layer 1142 may include a hole injection layer, a hole transfer layer, an electron blocking layer, a light emitting material layer, a hole blocking layer, an electron transfer layer and an electron injection layer. A material of the light emitting material layer may include a small molecular organic material or a polymer molecular organic material, which may be a fluorescent light emitting material or a phosphorescence light emitting material, and may emit red light, green light, blue light, white light or the like. The anode 1141 of each light emitting device 114 is isolated from each other through the pixel defining layer 1012, and may be made of indium tin oxide (ITO), indium zinc oxide (IZO), zinc oxide (ZnO) and other materials. The cathode 1143 of each light emitting device 114 is of an integrated structure arranged on the whole surface, which may be made of lithium (Li), aluminum (Al), magnesium (Mg), argentum (Ag) and other metal materials. In addition, in the disclosure, as shown in FIG. 13 and FIG. 14, the display substrate may further include: a buffer layer 115, a first gate insulating layer 116, a second gate insulating layer 117, an interlayer dielectric layer 118, an encapsulation layer 119, a passivation layer 120 and a transfer electrode 121. The encapsulation layer 119 may include a first inorganic encapsulation layer 1191, an organic encapsulation layer 1192 and a second inorganic encapsulation layer 1193.

It should be noted that in some embodiments, the planarization layer 1011 includes at least one layer, for example, it may be two layers (specifically may be a first planarization layer 1011*a* and a second planarization layer 1011*b*), the groove structure C may be arranged in the planarization layer 1011 farthest away from the base substrate 100, or may be arranged in the first planarization layer 1011*a* and the second planarization layer 1011*b*. In some other embodiments, the interlayer dielectric layer 118 and the planarization layer 1011 (or the second planarization layer 1011*b*) may further include the passivation layer 120 therebetween; and the groove structure C may be arranged in the planarization layer 1011 farthest away from the base substrate 100, or may be arranged in the first planarization layer 1011*a* and the second planarization layer 1011*b*, or may also be arranged in the first planarization layer 1011*a*, the second planarization layer 1011*b* and the passivation layer 120. In addition, in the disclosure, the inorganic insulating layer 105 provided with the hollowed-out structure H includes, but not limited to the inorganic insulating layer between the layer where the plurality of touch electrodes 103 are located and the layer where the plurality of bridging portions 104 are located, and may further include the first inorganic encapsulation layer 1191, the second inorganic encapsulation layer 1193, the first gate insulating layer 116, the second gate insulating layer 117, the interlayer dielectric layer 118 and the like.

In some embodiments, a shortest distance between the light emitting device 114 closest to the non-display region BB and the boundary of the inorganic insulating layer 105 is smaller than a shortest distance between the light emitting device 114 closest to the non-display region BB and the boundary of the organic insulating layer 101 (the boundary of the side of the groove structure C closest to the display region AA). In some embodiments, the shortest distance between the light emitting device 114 closest to the non-display region BB and the boundary of the organic insulating layer 101 (the boundary of the side of the groove structure C closest to the display region AA) is smaller than a shortest distance between the light emitting device 114 closest to the non-display region BB and the boundary of the side of the bending region PB closest to the display region AA.

In some embodiments, a shortest distance between the pixel driving circuit closest to the non-display region BB and the boundary of the inorganic insulating layer 105 is smaller than a shortest distance between the pixel driving circuit closest to the non-display region BB and the boundary of the organic insulating layer 101 (the boundary of the side of the groove structure C closest to the display region AA). In some embodiments, the shortest distance between the pixel driving circuit closest to the non-display region BB and the boundary of the organic insulating layer 101 (the boundary of the side of the groove structure C closest to the display region AA) is smaller than a shortest distance between the pixel driving circuit and the boundary of the side of the bending region PB closest to the display region AA.

Figure 15:
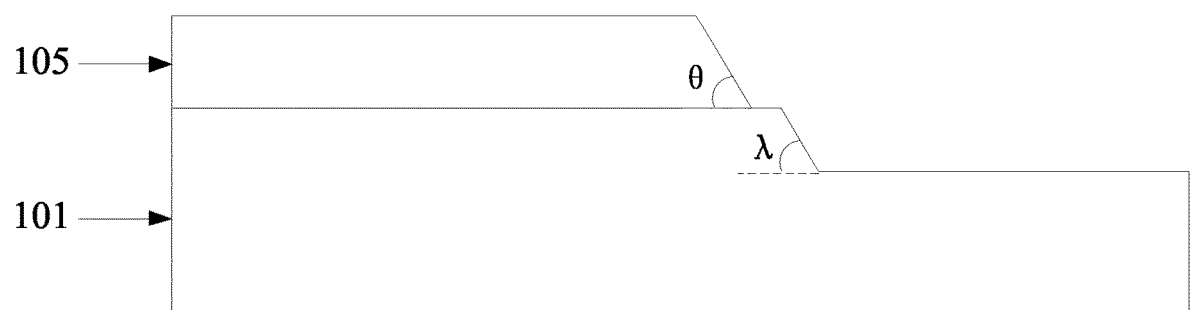
FIG. 15 is a schematic cross-sectional view along a line XII-XIII in FIG. 12.
Figure 16:
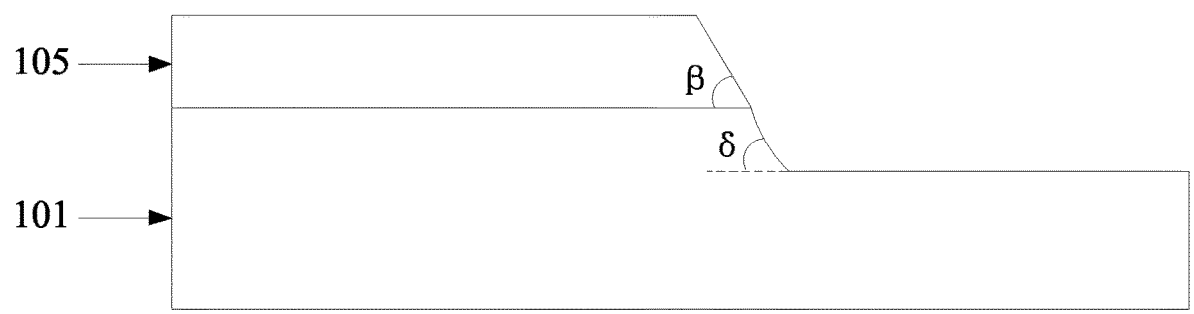
FIG. 16 is a schematic cross-sectional view along a line E-F in FIG. 12.

In some embodiments, as shown in FIG. 15, around the groove structure C, an angle of gradient $\lambda$ of the boundary of the organic insulating layer 101 is greater than an angle of gradient $\theta$ of the boundary of the inorganic insulating layer 105. Optionally, around the groove structure C, the angle of gradient $\lambda$ of the boundary of the organic insulating layer 101 is about and the angle of gradient $\theta$ of the boundary of the inorganic insulating layer 105 is about 30°. In some embodiments, an angle of gradient of the boundary of the inorganic insulating layer 105 closest to the encapsulation dam 106 is about 70°. In some embodiments, as shown in FIG. 16, an angle of gradient $\delta$ of the organic insulating layer 101 at the boundary of the inorganic insulating layer 105 farthest away from the encapsulation dam 106 is greater than the above angle of gradient $\lambda$, an angle of gradient $\beta$ of the boundary of the inorganic insulating layer 105 farthest away from the encapsulation dam 106 may be smaller than or equal to the angle of gradient $\delta$ of the organic insulating layer 101 at this position, and preferably the angle of gradient $\beta$ is equal to $\delta$. In some embodiments, the angle of gradient $\delta$ of the boundary of the organic insulating layer 101 is about 70°, and the angle of gradient $\beta$ of the boundary of the inorganic insulating layer 105 is about 60°-70°. In some embodiments, as shown in FIG. 16, in a process of manufacturing the inorganic insulating layer 105, the organic insulating layer 101 will be over-etched towards the side away from the groove structure C. In addition, "about" means that values within the allowable error range of the manufacturing process (such as ±10%) all belong to the scope of protection of the disclosure.

Based on the same inventive concept, an embodiment of the disclosure further provides a display panel, including the above display substrate provided by the embodiment of the disclosure.

In some embodiments, the display panel may be an organic light emitting diode (OLED) display panel, a quantum-dot light emitting diode (QLED) display panel or a micro light emitting diode (Micro LED) display panel. Since the principle for solving problems of the display panel is similar to that of the above display substrate, implementation of the display panel provided by the embodiment of the disclosure may refer to implementation of the above display substrate provided by the embodiment of the disclosure, and repetitions will not be made. Other essential components (such as a polarizer) of the display panel should be understood by those ordinarily skilled in the art, and are not repeated here, nor should it be used as a limitation to the disclosure.

Based on the same inventive concept, an embodiment of the disclosure further provides a display apparatus, including the above display panel provided by the embodiment of the disclosure.

The display apparatus may be: a mobile phone, a tablet computer, a television, a display, a laptop, a digital photo frame, a navigator, a smart watch, a fitness wrist strap, a personal digital assistant and any product or component with a display function. Other essential components (such as a driving chip) of the display apparatus should be understood by those ordinarily skilled in the art, and are not repeated here, nor should it be used as a limitation to the disclosure. In addition, since the principle for solving problems of the display apparatus is similar to that of the above display panel, implementation of the display apparatus provided by the embodiment of the disclosure may refer to implementation of the above display panel, and repetitions will not be made.

Apparently, those skilled in the art may perform various changes and modifications on the embodiments of the disclosure without departing from the spirit and scope of the embodiments of the disclosure. Therefore, if these changes and modifications on the embodiments of the disclosure fall within the scope of the claims of the disclosure and their equivalent technologies, the disclosure is also intended to include these changes and modifications.

What is claimed is:

1. A display substrate, comprising:
a base substrate, comprising a display region and a non-display region on a side of the display region;
an encapsulation dam, located in the non-display region and arranged around the display region, wherein an orthographic projection of the encapsulation dam on the base substrate does not overlap with the display region;
an organic insulating layer on the base substrate; wherein the organic insulating layer has a groove structure, and the groove structure is disposed on a side of the encapsulation dam facing away from the display region; wherein the non-display region comprises a bending region, and the groove structure is located between the encapsulation dam and the bending region;
a touch structure on a side of the organic insulating layer facing away from the base substrate, wherein the touch structure comprises a plurality of touch lines extending to the non-display region; and
an inorganic insulating layer at the side of the organic insulating layer facing away from the base substrate, wherein the inorganic insulating layer has a hollowed-out structure exposing the groove structure on the side of the encapsulation dam away from the display region, and an orthographic projection of the hollowed-out structure does not overlap with orthographic projections of the plurality of touch lines on the base substrate.

2. The display substrate according to claim 1, wherein the touch structure further comprises: a plurality of touch electrodes and a plurality of bridging portions in the display region; wherein
each touch line comprises: a first part disposed in a same layer as the plurality of touch electrodes, and a second part disposed in a same layer as the plurality of bridging portions and electrically connected with the first part;
the plurality of touch electrodes are electrically connected with the plurality of touch lines, and each bridging portion is electrically connected with two touch electrodes correspondingly; and
the inorganic insulating layer is located between a layer where the plurality of touch electrodes are located and a layer where the plurality of bridging portions are located.

3. The display substrate according to claim 2, wherein the plurality of bridging portions are located between the layer where the plurality of touch electrodes are located and the organic insulating layer.

4. The display substrate according to claim 3, further comprising: at least one floating line in the non-display region; wherein
the plurality of touch lines are divided into at least one group of touch lines, and the at least one floating line is located on at least one of two sides of the at least one group of touch lines.

5. The display substrate according to claim 4, wherein the plurality of touch lines are divided into two groups of touch lines, the at least one floating line is plural, and the plurality of floating lines are located at two sides of each group of touch lines respectively.

6. The display substrate according to claim 5, wherein each group of touch lines is arranged in a first direction and extends in a second direction, the first direction intersects with the second direction; and
the plurality of floating lines are located at the two sides of each group of touch lines in the first direction respectively.

7. The display substrate according to claim 5, wherein the plurality of floating lines are arranged in at least one of the layer where the plurality of touch electrodes are located or the layer where the plurality of bridging portions are located.

8. The display substrate according to claim 7, wherein the plurality of floating lines comprise: a plurality of first floating lines disposed in a same layer as the plurality of touch electrodes, and a plurality of second floating lines disposed in a same layer as the plurality of bridging portions; wherein
in a direction perpendicular to the base substrate, part of the first floating lines and the plurality of second floating lines are arranged correspondingly, and rest of the first floating lines do not overlap with the plurality of second floating lines.

9. The display substrate according to claim 8, wherein a region where the part of the first floating lines are located is located between a region where the rest of the first floating lines are located and a region where the touch lines are located.

10. The display substrate according to claim 9, wherein a quantity of the rest of the first floating lines is greater than a quantity of the part of the first floating lines.

11. The display substrate according to claim 8, wherein orthographic projections of the plurality of second floating lines on the base substrate completely coincide with orthographic projections of the part of the first floating lines.

12. The display substrate according to claim 8, wherein orthographic projections of the part of the first floating lines on the base substrate are located in an orthographic projection of the inorganic insulating layer; and
an orthographic projection of part of a structure of at least one of the rest of the first floating lines on the base substrate overlaps with the hollowed-out structure and does not overlap with the groove structure, and other part of the structure of at least one of the rest of the first floating lines on the base substrate does not overlap with the hollowed-out structure.

13. The display substrate according to claim 5, wherein in the first direction, a first distance between every two adjacent floating lines, a second distance between every two adjacent touch lines and a third distance between a floating line and a touch line which are adjacent each other are the same.

14. The display substrate according to claim 13, wherein the first distance, the second distance and the third distance are 4 µm-25 µm.

15. The display substrate according to claim 5, wherein the plurality of floating lines extend from edges of one sides of the plurality of touch lines close to the display region to be flush with ends of one sides of the plurality of touch lines away from the display region.

16. The display substrate according to claim 5, wherein a quantity of the plurality of floating lines at two sides of each group of touch lines is the same.

17. The display substrate according to claim 2, wherein the plurality of touch lines comprise a plurality of touch driving lines and a plurality of touch sensing lines;

the plurality of touch electrodes comprise: a plurality of touch driving electrodes arranged in the first direction, and a plurality of touch sensing electrodes arranged in the second direction; and each touch driving line is electrically connected with one row of touch driving electrodes, and each touch sensing line is electrically connected with one column of touch sensing electrodes.

18. The display substrate according to claim 1, wherein the organic insulating layer comprises:

a planarization layer; and a pixel defining layer on a side of the planarization layer facing away from the base substrate.

19. The display substrate according to claim 18, wherein the planarization layer is of a single-layer structure or a double-layer structure.

20. A display panel, comprising the display substrate according to claim 1.

* * * * *